US008428276B2

(12) United States Patent
Oliver

(10) Patent No.: US 8,428,276 B2
(45) Date of Patent: Apr. 23, 2013

(54) FREQUENCY-WARPED AUDIO EQUALIZER

(75) Inventor: Richard J. Oliver, Capistrano Beach, CA (US)

(73) Assignee: DTS LLC, Calabasas, CA (US)

( * ) Notice: Subject to any disclaimer, the term of this patent is extended or adjusted under 35 U.S.C. 154(b) by 196 days.

(21) Appl. No.: 12/826,340

(22) Filed: Jun. 29, 2010

(65) Prior Publication Data

US 2010/0266143 A1    Oct. 21, 2010

Related U.S. Application Data

(63) Continuation of application No. 12/044,826, filed on Mar. 7, 2008, now Pat. No. 7,764, 802.

(60) Provisional application No. 60/894,076, filed on Mar. 9, 2007.

(51) Int. Cl.
*H03G 5/00* (2006.01)

(52) U.S. Cl.
USPC ............... 381/103; 381/98; 333/28 R; 700/94

(58) Field of Classification Search .................... 381/98, 381/103; 333/28 R; 700/94; 708/300, 400
See application file for complete search history.

(56) References Cited

U.S. PATENT DOCUMENTS

| 3,750,044 A * | 7/1973 | Stanley ........................ 330/126 |
| 4,819,269 A | 4/1989 | Klayman |
| 4,836,329 A | 6/1989 | Klayman |
| 4,841,572 A | 6/1989 | Klayman |
| 4,866,774 A | 9/1989 | Klayman |
| 5,195,141 A | 3/1993 | Jang |
| 5,319,713 A | 6/1994 | Waller, Jr. et al. |
| 5,333,201 A | 7/1994 | Waller, Jr. |
| 5,491,685 A | 2/1996 | Klein et al. |
| 5,638,452 A | 6/1997 | Waller, Jr. |
| 5,661,808 A | 8/1997 | Klayman |
| 5,727,074 A | 3/1998 | Hildebrand |
| 5,771,295 A | 6/1998 | Waller, Jr. |

(Continued)

FOREIGN PATENT DOCUMENTS

| JP | 10-032613 | 2/1998 |
| JP | 10-256857 | 9/1998 |

(Continued)

OTHER PUBLICATIONS

Lee, L. and Rose, R.C. Speaker normalization using efficient frequency warping procedures. In *Proc. Int. Conf. on Acoust., Speech, and Sig. Proc.*, p. 353-356, May 1996.

(Continued)

*Primary Examiner* — Vivian Chin
*Assistant Examiner* — Paul Kim
(74) *Attorney, Agent, or Firm* — Knobbe Martens Olson & Bear LLP

(57) ABSTRACT

In certain embodiments, an improved audio equalization filter can be generated by frequency warping one or more digital filters having a plurality of frequency bands. Frequency warping can include, for example, transforming at least some of the frequency bands of the one or more digital filters into lower frequency bands. As a result, in various implementations the audio equalization filter may be more accurate than certain currently-available IIR equalization filters. The audio equalization filter may also be more computing-resource efficient than certain currently-available FIR equalization filters.

14 Claims, 14 Drawing Sheets

U.S. PATENT DOCUMENTS

| | | |
|---|---|---|
| 5,784,468 A | 7/1998 | Klayman |
| 5,850,453 A | 12/1998 | Klayman et al. |
| 5,881,107 A | 3/1999 | Termerinac et al. |
| 5,912,976 A | 6/1999 | Klayman et al. |
| 5,970,152 A | 10/1999 | Klayman |
| 6,281,749 B1 | 8/2001 | Klayman et al. |
| 6,285,767 B1 | 9/2001 | Klayman |
| 6,590,983 B1 | 7/2003 | Kraemer |
| 6,664,460 B1 | 12/2003 | Pennock et al. |
| 6,993,480 B1 | 1/2006 | Klayman |
| 7,031,474 B1 | 4/2006 | Yuen et al. |
| 7,215,787 B2 | 5/2007 | Sternad et al. |
| 7,277,767 B2 | 10/2007 | Yuen et al. |
| 7,567,675 B2 | 7/2009 | Bharitkar et al. |
| 2004/0125962 A1 | 7/2004 | Christoph |
| 2005/0249272 A1* | 11/2005 | Kirkeby et al. ............... 375/232 |
| 2007/0094319 A1 | 4/2007 | Behrens et al. |

FOREIGN PATENT DOCUMENTS

| | | |
|---|---|---|
| JP | 2000-267692 | 9/2000 |
| JP | 2001-326991 | 11/2001 |
| JP | 2004-248298 | 9/2004 |
| JP | 2007-017905 | 1/2007 |

OTHER PUBLICATIONS

M. Karjalainen, et al., "Realizable Warped IIR Filter Structures", Proc. Of the IEEE Nordic Signal Processing Symposium, Norsig 96, 1996, pp. 483-486.

Harma A et al., "Frequency-Warped Signal Processing for Audio Applications", Journal of the Audio Engineering Society, Audio Engineering Society, New York, NY, US, vol. 48, No. 11, Nov. 1, 200, pp. 1011-1031.

European Search Report dated Dec. 7, 2010.

Chinese Office Action issued in application No. 200880007532.0 on Feb. 3, 2012.

Office Action issued in Japanese application No. 2009-552916 on Sep. 11, 2012.

\* cited by examiner

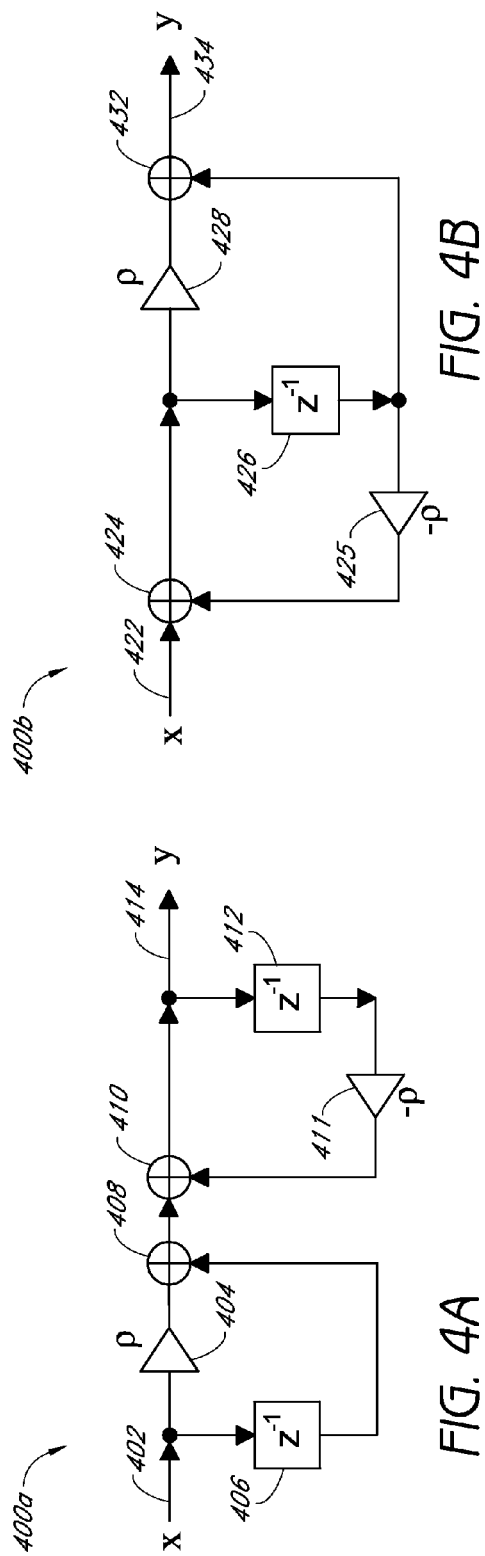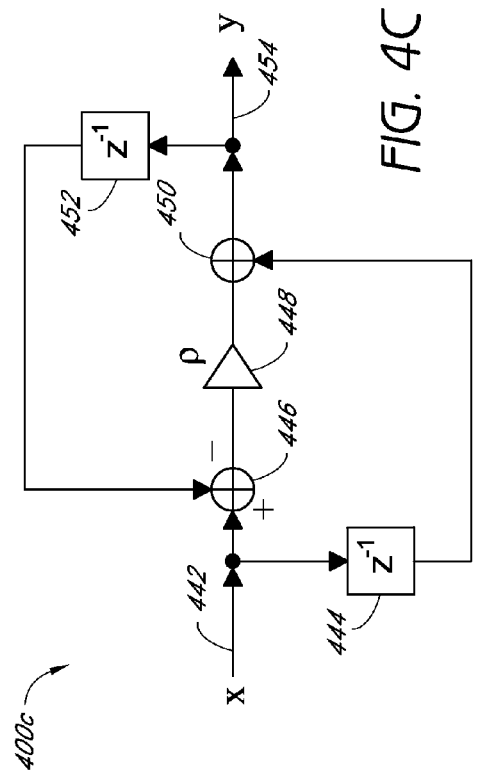
FIG. 4A
FIG. 4B
FIG. 4C

FREQUENCY-WARPED AUDIO EQUALIZER

CROSS-REFERENCE TO RELATED APPLICATIONS

This application is a continuation application of U.S. application Ser. No. 12/044,826 filed Mar. 7, 2008 and claims priority benefit from U.S. Provisional Application No. 60/894,076 filed Mar. 9, 2007, entitled "Audio Processing Systems and Methods," the disclosures of both of which are hereby incorporated by reference in their entirety.

BACKGROUND

Description of the Related Technology

Audio equalizers generally include one or more sliding controls that enable a user to control a frequency response of an audio signal. By moving sliders, a user can affect the gain of an audio signal at selected frequency bands. Raising a slider generally boosts affected frequencies, while lowering a slider generally cuts or attenuates the affected frequencies. Audio equalizers may include hardware sliders or software sliders. Equalizers with a set of sliders that control signal gain at a predefined set of frequencies are often referred to as graphic equalizers.

In a typical audio equalizer, each slider corresponds to a specific frequency band. The number of frequency bands or sliders in an equalizer can be as few as two and as many as thirty or more. For computing devices that implement graphic equalizers, a common specification, according to the American National Standards Institute (ANSI), is ten octave-spaced frequency bands with a ±12 decibel (dB) gain range.

In designing an audio equalizer, there is a tradeoff between computing resource usage (e.g., processing and memory resources) and the accuracy with which a user's settings affect the actual frequency response of the audio signal.

SUMMARY

In certain embodiments, a method for generating an audio equalization filter includes providing one or more filters comprising a plurality of frequency bands, where the one or more filters each include a digital filter. The method can further include frequency warping the one or more filters to create an audio equalization filter, where frequency warping the one or more filters can include performing a transformation of at least some of the frequency bands of the one or more filters. Advantageously, in certain embodiments the audio equalization filter can filter an input audio signal such that certain frequencies of the input audio signal are selectively emphasized or deemphasized based at least in part on an input of a user.

Various embodiments of a system can also be provided for processing audio signals, where the system includes an audio signal input and an audio equalization filter that can be coupled to the audio signal input. The audio equalization filter can be a frequency-warped form of one or more filters, where the one or more filters can each include a digital filter. In addition, the system can include an equalizer interface in communication with the audio equalizer filter. The equalizer interface can provide controls for adjusting gain values of the frequency bands of the audio equalization filter. Additionally, a user input to the equalizer interface can cause the audio equalization filter to selectively emphasize or deemphasize one or more frequency bands of the audio signal input.

In addition, a method for processing audio signals can be provided that includes receiving an audio input signal, receiving a desired gain input including one or more desired gain values for one or more frequency bands of the audio input signal, adjusting one or more internal gain values of an equalization filter in response to receiving the desired gain input, where the equalization filter is a frequency-warped form of one or more digital filters, and filtering the audio input signal with the equalization filter to selectively emphasize or deemphasize the one or more frequency bands based at least in part on the one or more internal gain values.

Neither this summary nor the following detailed description purports to define the inventions disclosed herein. Certain of the inventions disclosed herein are defined by the claims.

BRIEF DESCRIPTION OF THE DRAWINGS

FIGS. 4A through 4C illustrate embodiments of all-pass filters for use with certain equalization filters;

DETAILED DESCRIPTION

Figure 1:
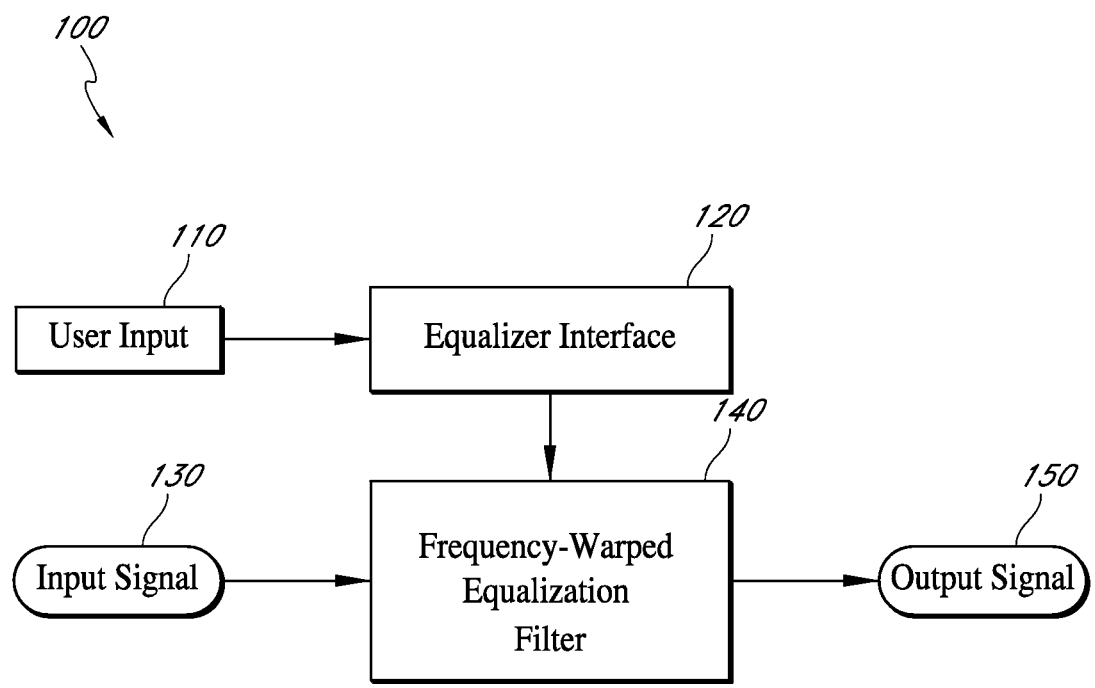
FIG. 1 illustrates an embodiment of an audio equalization system.

Audio equalizers generally include one or more user-adjustable equalization filters that adjust the frequency response of an input audio signal. The type of filter chosen for an equalizer can affect the computing resource usage and the accuracy of the equalizer. Two common equalization filter types are those that use an infinite impulse response (IIR) filter and those that use a finite impulse response (FIR) filter. IIR equalization filters can often be implemented with relatively fewer computing resources than FIR equalization filters, but IIR equalization filters tend to be quite inaccurate. FIR equalization filters, on the other hand, can achieve a more accurate frequency response than many IIR equalization filters, with a tradeoff in increased usage of computing resources.

Because IIR equalization filters are typically resource-efficient, they are often employed in mobile devices such as media players (e.g., MP3 players), cell phones, smart phones, personal digital assistants (PDAs), and the like. In a typical IIR equalization filter used in many mobile devices, a plurality of frequency-selective (e.g., band-pass) filters are provided. Each frequency-selective filter corresponds to a frequency band of the equalization filter. One drawback of these filters is that adjusting a gain of a selected frequency band can affect frequencies in adjacent bands. As a result, accuracy of these simple IIR equalization filters tends to be poor. IIR equalization filters can be improved by increasing the order of the frequency-selective filters or by including frequency response correction mechanisms. However, these measures can increase the computing resource usage of these filters.

In a typical FIR equalization filter, a long filter length (e.g., many coefficients) is used to achieve the desired frequency response at low frequencies. At low frequencies, the typical equalizer's frequency bands are closer together than at higher frequencies. For example, low frequency bands might include 32 Hz, 64 Hz, 125 Hz, and so on, while higher frequency bands might include 4 kHz, 8 kHz, 16 kHz, and so on. Thus, to achieve the closer spacing of the lower frequencies (e.g., a higher resolution at low frequencies), the filter length of many FIR equalization filters is quite long. This long filter length increases accuracy over typical IIR equalization filters but often results in usage of more computing resources. The high computing resource cost of FIR equalization filters can prohibit their use in mobile devices.

Thus, in certain embodiments systems and methods for enhancing audio equalization filters are provided that reduce or eliminate the above-mentioned problems. In certain implementations, for example, enhanced equalization filters can be designed using an initial filter having favorable computing resource usage characteristics. The initial filter can be frequency-warped into an equalization filter, which may advantageously use computing resources more efficiently than many FIR equalization filters and have better accuracy than many IIR equalization filters. As a result, the frequency-warped equalization filter can enhance a mobile device user's audio listening experience. In addition, frequency-warped equalization filters may be implemented in computing devices other than mobile devices in various embodiments.

The features of these systems and methods will now be described with reference to the drawings summarized above. Throughout the drawings, reference numbers are re-used to indicate correspondence between referenced elements. The drawings, associated descriptions, and specific implementation are provided to illustrate embodiments of the inventions disclosed herein and not to limit the scope of the inventions disclosed herein.

In addition, signal processing algorithms described herein are not limited to any particular sequence, and the blocks or states relating thereto can be performed in other sequences that are appropriate. For example, described blocks or states may be performed in an order other than that specifically disclosed, or multiple blocks or states may be combined in a single block or state. Moreover, the various modules, blocks, and components of the systems described herein can be implemented as software applications, modules, or hardware components on one or more computing devices. While the various modules, components, and blocks are illustrated separately, they may share some or all of the same underlying logic or code.

Referring to FIG. 1, an example audio equalization system 100 is illustrated. Certain embodiments of the audio equalization system 100 enable a more accurate adjustment of a frequency response of an audio signal, while using fewer computing resources than certain currently-available audio equalization filters. The audio equalization system 100 can be implemented, for example, as a software module on a computing device such as a desktop computer, laptop, media player, smart phone, PDA, combinations of the same and the like. In addition, the audio equalization system 100 can be implemented in hardware circuitry or as a combination of software and hardware.

In the audio equalization system 100, a user input 110 can be provided to an equalizer interface 120. The equalizer interface 120 can be a hardware or software interface that can include sliders for selectively adjusting gain values (including boosting or cutting) of an audio signal. The user input 110 can include gain values provided by user adjustment of the sliders.

Figure 2:
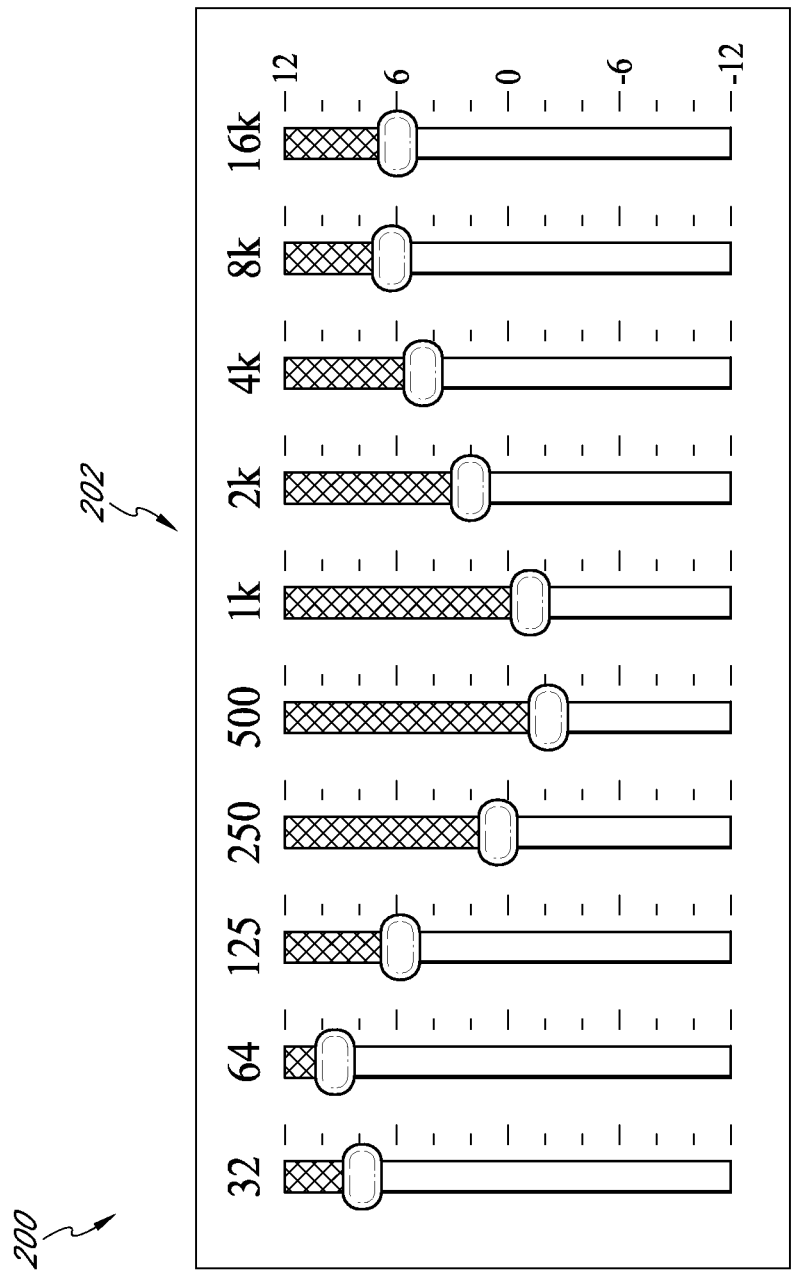
FIG. 2 illustrates an example graphic equalizer for use with certain embodiments of the audio equalization system of FIG. 1.

An example equalizer interface 200 is illustrated in FIG. 2. The depicted equalizer interface 200 represents an interface implemented in software. The equalizer interface 200 has a plurality of sliders 202, each corresponding to a frequency band. Ten sliders 202 are shown for ten frequency bands ranging from 32 Hz to 16 kHz. The sliders 202 can be moved up and down by an input device such as a mouse, button, or a user's finger. In the depicted embodiment, moving a slider 202 up can increase the gain of the selected frequency band, and moving a slider 202 down can decrease the gain of the selected frequency band. The gain values in the example equalizer interface 200 range from −12 dB to +12 dB. Many other gain values are possible.

Turning again to FIG. 1, the equalizer interface 120 provides an output to a frequency-warped equalization filter 140 based on the user input 110. The output can include a set of desired gain values corresponding to selected slider values adjusted by a user. The frequency-warped equalization filter 140 can use these desired gain values to adjust the frequency response of an audio input signal 130 to provide an audio output signal 150. The audio output signal 150 can be provided, for example, to a speaker or can be stored as a file on a computer readable medium, such as a hard disk, flash drive, memory, combinations of the same, or the like.

The frequency-warped equalization filter 140 can include one or more frequency-selective filters for adjusting the frequency response of the input signal 130. Advantageously, the frequency-warped equalization filter 140 can be designed or otherwise generated using frequency warping techniques. In certain implementations, for example, the equalization filter 140 can be designed by frequency-warping one or more initial filters (see, e.g., FIGS. 6A and 8) having favorable computing resource usage characteristics. In certain embodiments, the initial filter (or filters) is a digital filter. The initial filter can, but need not be, a FIR filter. For purposes of illustration, the remainder of this specification shall refer to the frequency-warping of FIR initial filters; however, in certain embodiments, the equalization filter 140 can also be designed by frequency warping IIR initial filters.

The initial filter in certain embodiments can have at least some frequency bands that have higher center frequencies than at least some frequency bands of the equalization filter 140. These relatively higher-frequency bands can advantageously be represented by fewer filter coefficients than certain currently-available equalization filters. The initial filter can be transformed into the equalization filter 140 in certain embodiments by frequency warping at least some frequency bands of the initial filter to lower frequency bands. Advantageously, frequency warping the initial filter in this manner can result in an equalization filter 140 that uses computing resources better than certain FIR equalization filters and that has frequency response accuracy better than certain IIR equalization filters. For example, the frequency equalization filter 140 can minimize the effects of changes in one frequency band on adjacent bands, thereby increasing the accuracy of the filter 140.

In certain embodiments, the frequency-warping transform used to generate the frequency warped equalization filter 140 can be a transform such as a bilinear transform, or more generally, a conformal mapping, which maps lines or circles onto other lines or circles in the Laplace or Z transform domains. Frequency warping techniques can therefore be used in certain embodiments to transform a frequency scale of the initial filter onto a modified frequency scale. In certain embodiments, this transformation is a spectral transformation of one digital filter (the initial filter) into another digital filter (the equalization filter 140). This transformation is performed in certain implementations by replacing one or more delay blocks in the initial filter with one or more all-pass filters. Frequency warping is described in greater detail below with respect to FIGS. 3 through 8.

As used herein, the term "all-pass filter," in addition to having its broad ordinary meaning, can also mean any filter that passes a substantial number or amount of frequencies (e.g., in the audible frequency spectrum or within a subset thereof). Various all-pass filters used for frequency warping may or may not pass all frequencies equally in certain embodiments. The all-pass filter can be a phase-shift filter, time-delay filter, delay equalizer, or the like. In one embodiment, an all-pass filter is any filter whose spectral magnitude is unity or is substantially unity. The all-pass filters described herein may have unity gain or greater or less than unity gain. Moreover, an all-pass filter can be any filter whose amplitude response is flat or substantially flat over a wide range of frequencies, which range may be limited by circuitry bandwidth or a number of bits of precision in a processor. In addition, while the remainder of this specification refers to frequency warping using all-pass filters, in some embodiments, other filters that may be used to perform frequency warping can be substituted for the all-pass filters described herein.

Figure 3A:
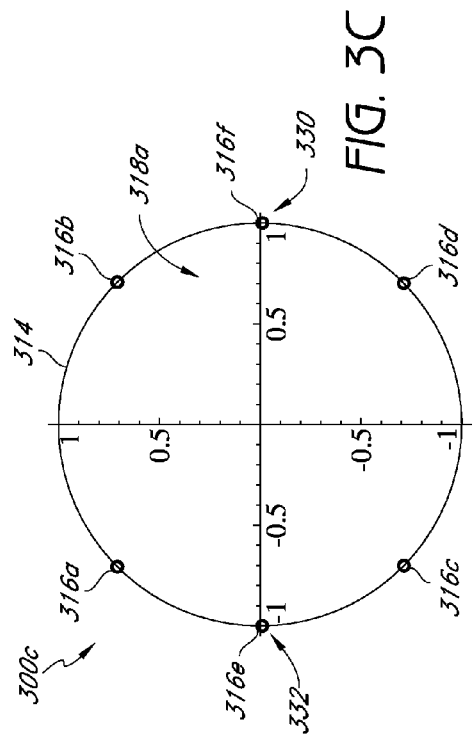
FIG. 3A illustrates an embodiment of a frequency response of an example initial filter.
Figure 3B:
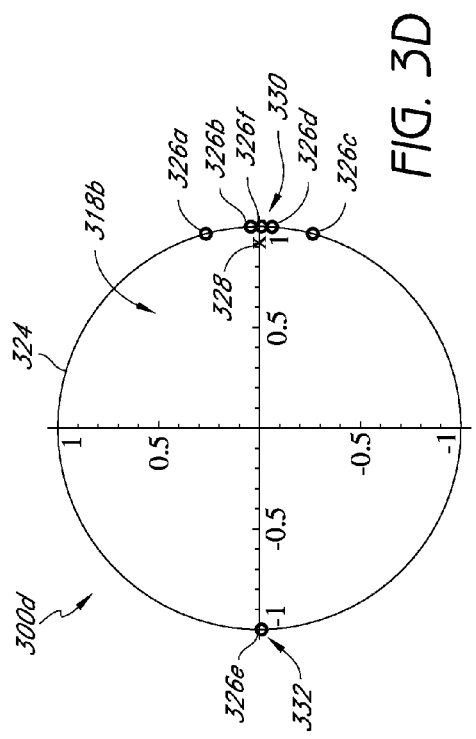
FIG. 3B illustrates an embodiment of a frequency response of a frequency-warped version of the initial filter of FIG. 3A.

FIGS. 3A and 3B illustrate frequency responses 300 of two example filters (not shown). FIG. 3A illustrates an example frequency response 300a of an initial filter, while FIG. 3B illustrates an example frequency response 300b of a frequency-warped version of the initial filter. The frequency responses 300 are shown having one frequency band for ease of illustration. However, the principles of FIGS. 3A and 3B can be extended to filters having multiple frequency bands, as described below.

Turning to FIG. 3A, the example frequency response 300a of the initial filter is depicted with a trace 312, which illustrates the contours of the frequency response 300a. The trace 312 shows that the example frequency response 300a includes a frequency band having a peak magnitude or center frequency of about 1100 Hz and falling off before and after 1100 Hz. Thus, the frequency response 300a emphasizes frequencies in a band around the center frequency of about 1100 Hz and attenuates other frequencies.

Figure 3C:
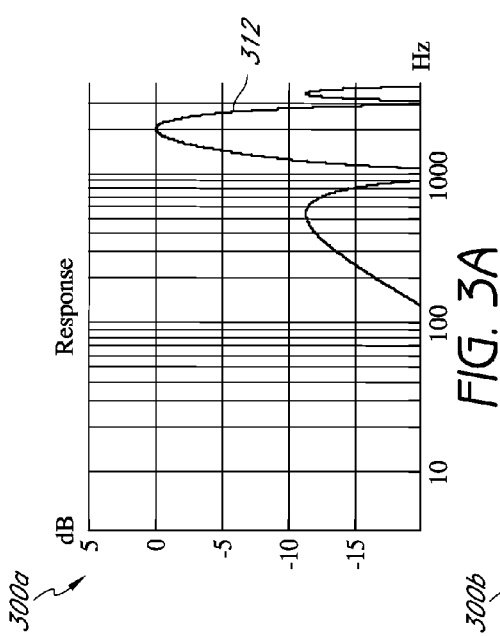
FIG. 3C illustrates an embodiment of a pole-zero plot corresponding to the frequency response of FIG. 3A.

A pole-zero plot 300c of the initial filter having the frequency response 300a is shown in FIG. 3C. The pole-zero plot 300c is shown plotted in a complex plane 318a. The complex plane 318a includes a unit circle 314 and zeros 316 of the initial filter. The location of the zeros 316 in the complex plane 318a are example locations and can be varied in other examples.

Turning to FIG. 3B, the frequency response 300b illustrates one example of a frequency-warped version of the frequency response 300a. The frequency response 300b is depicted with a trace 322, which illustrates the contours of the frequency response 300b. The trace 322 indicates that the example frequency response 300b includes a frequency band having a peak magnitude at about 125 Hz and falling off before and after about 125 Hz. Thus, the frequency response 300b emphasizes frequencies in a band around the center frequency of about 125 Hz and attenuates other frequencies. As can be seen from FIGS. 3A and 3B, the frequency response 300a has a center frequency (about 1100 Hz) that is relatively higher in frequency than the center frequency (about 125 Hz) of the frequency response 300b.

Figure 3D:
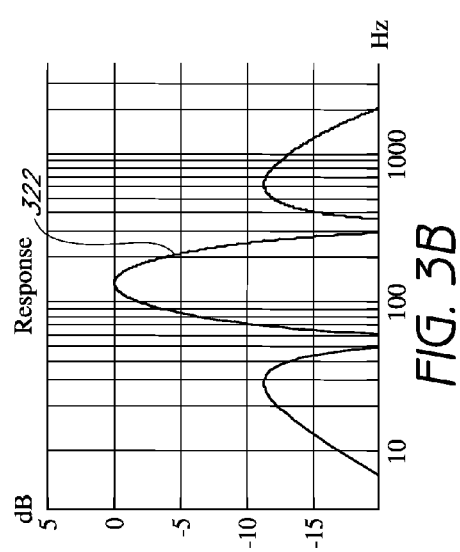
FIG. 3D illustrates an embodiment of a pole-zero plot corresponding to the frequency response curve of FIG. 3B.

A pole-zero plot 300d of the frequency-warped filter having the frequency response 300b is shown in FIG. 3D. The pole-zero plot 300d is also shown plotted in a complex plane 318b. The complex plane 318b includes a unit circle 324 and zeros 326 of the frequency-warped filter. The location of the zeros 326 in the complex plane 318b are example locations and can be varied to achieve different amounts of frequency warping, as will be described below.

In certain embodiments, frequency warping of the frequency response 300a into the frequency response 300b can be achieved by transforming or mapping the zeros 316 of the initial filter into zeros 326 in another location in the complex plane 318. In the present example, the zeros 316 have been transformed or mapped onto new example locations represented by the zeros 326. Each of the zeros 326a through 326f corresponds to a zero 316a through 316f, respectively. In addition, a pole 328 has been added to the plot 300d. This transformation of the zeros 316 into the zeros 326 and addition of the pole 328 can result in the shifting or warping of the frequency response 300a into the frequency response 300b.

In effect, frequency warping in certain embodiments maps an initial digital filter to another digital filter by mapping the unit circle 314 of the Z transform onto itself. Thus, the unit circle 314 of the plot 300c has been mapped onto the unit circle 324 of the plot 300d. In an embodiment, moving (or mapping) the zeros 316a, 316b, 316c, and 316d along the unit circle 314 closer to the point z=1 (at 330) causes the frequency response 300a to "move" or be warped to a lower center frequency. Conversely, moving (or mapping) the zeros 316a, 316b, 316c, and 316d along the unit circle 314 closer to the point z=−1 (at 332) could cause the frequency response 300a to move to a higher center frequency.

Not all zeros 326 need be moved to different locations in certain embodiments. For example, the zero 316f at the DC point where z=1 (at 330) has been mapped onto itself as zero 326f, and the zero 316e at the Nyquist point at z=−1 (at 332) has been mapped onto itself as the zero 326e. Moreover, in certain embodiments, frequency warping may map any frequency between the DC and the Nyquist points of the initial filter onto any other frequency between the DC and Nyquist points. The degree to which the zeros 316 are moved or warped can be controlled by one or more warping factors, as is described below with respect to FIGS. 4-8.

The frequency warping transformation from the frequency response 300a to the frequency response 300b can be performed in certain implementations by replacing each delay block (not shown) in the initial filter with one or more all-pass filters (see, e.g., FIGS. 4-8). In some implementations, two all-pass filters are used for each frequency band. Thus, in the example embodiment depicted in FIGS. 3A through 3D, two all-pass filters may be used to warp the frequency response 300a into the frequency response 300b. However, more or fewer all-pass filters may be used for each frequency band in other embodiments. Using an all-pass filter can result in the pole 328 being added to the pole-zero plot 300d of the frequency-warped response 300b. Further details of example all-pass filters are described below with respect to FIGS. 4-8.

The principles of frequency-warping described above with respect to FIGS. 3A through 3D can be extended to multiple frequency bands. In certain embodiments, an initial filter having at least some relatively higher-frequency bands can be frequency-warped into an equalization filter having at least some relatively lower-frequency bands. For example, an initial filter having equally-spaced frequency bands centered at 1 kHz, 3 kHz, 5 kHz, 7 kHz, 9 kHz, 11 kHz, 13 kHz, 15 kHz, 17 kHz, and 19 kHz might be frequency warped into an audio equalization filter having octave-spaced frequency bands centered at 32 Hz, 64 Hz, 125 Hz, 250 Hz, 500 Hz, 1 kHz, 2 kHz, 4 kHz, 8 kHz, and 16 kHz, respectively. This example illustrates that the initial filter band at 1 kHz, for example, can be warped into the band at 32 Hz of the equalization filter, the 3 kHz band of the initial filter can be warped into the 64 Hz band, and so on.

However, the same example set of initial filter bands can also be warped in different ways. For instance, at least some of the initial filter bands can be warped into lower frequencies while other initial filter bands can be warped into higher frequencies. As one example, the initial filter band at 15 kHz may be warped into a 16 kHz band, while the initial filter band at 17 kHz may be warped into an 8 kHz band. In another example, the initial filter band at 1 kHz could be warped into a 64 Hz band, while the initial filter band at 3 kHz could be warped into a 32 Hz band. Additionally, in some implementations at least a portion of the initial filter bands are not warped, while others are warped. Many other configurations for warping initial filter bands can be used in various embodiments.

While equally-spaced bands are warped into octave-spaced (e.g., ANSI) bands in the previous examples, non-equally spaced bands can be warped into octave-spaced bands in some embodiments. In addition, equally-spaced or non-equally-spaced bands can be warped into non-octave-spaced bands. For example, various bands can be warped into bands that are spaced according to some multiple of octave spacing, such as one-third octave spacing. Alternatively, various bands can be warped into bands spaced according to or substantially similar to a Bark scale, mel scale, or a portion thereof. Bark or mel scale spacing can provide a perceptual scale of frequency bands that many listeners would perceive to be equal or approximately equal in distance from one another.

Advantageously, in certain embodiments, the initial filter can be a FIR filter. As discussed above, implementing an equalization filter with a FIR filter can achieve greater accuracy than using IIR filters. However, FIR filters often use more computing resources due to the long filter lengths used to achieve higher resolution at lower frequencies. Thus, in one embodiment, a frequency-warped equalization filter can be generated by frequency warping a FIR filter having at least some higher frequency bands relative to desired frequency bands of an equalization filter. Since a FIR filter with relatively higher frequency bands can have a shorter filter length than a FIR filter with relatively lower frequency bands, frequency warping a FIR filter with relatively higher frequency bands can achieve an equalization filter with a relatively shorter filter length than certain FIR equalization filters. As a result, the frequency-warped equalization filter can have accuracy comparable to or better than FIR equalization filters while achieving performance comparable to or better than IIR filters.

FIGS. 4A through 4C illustrate various example all-pass filters 400 that can be used for frequency warping in certain embodiments. As described above, frequency warping can be implemented by replacing each delay block in an initial filter with one or more all-pass filters. The all-pass filters can be first order or higher order filters; however, to improve performance, in certain embodiments first-order filters can be used. Several example first order all-pass filters 400 are therefore shown in FIGS. 4A, 4B, and 4C.

Turning to FIG. 4A, an all-pass filter 400a is shown. The all-pass filter 400a is an IIR filter having a Direct Form I structure. The Direct Form I structure of the all-pass filter 400a has two multipliers 404, 411, two adders 408, 410, and two delay blocks 406, 412. The all-pass filter 400a receives an input signal 402 and provides an output signal 414. Arrows indicate the direction of the flow of signals in the output filter structure 400a, or alternatively, indicate the direction of algorithmic flow. Thus, for example, the input signal 402 is provided to a multiplier 404 and to a delay block 406.

The multiplier 404 provides an output to the adder 408. Likewise, the delay block 406 provides an output to the adder 408. The outputs of the multiplier 404 and the delay block 406 are added by the adder 408 and provided to the adder 410. The output of the adder 410 is provided to the delay block 412 and as the output 414. As part of a feedback loop, the delay block 412 provides an output to the multiplier 411. The output of the multiplier 411 is provided to the adder 410, which as described above, provides the output signal 414.

The multiplier 404 has a value ρ in the depicted embodiment. Likewise, the multiplier 411 has a value that is the negative of ρ. This value ρ can be a warping factor in certain embodiments. Adjusting the warping factor can change the amount of frequency warping provided by the all-pass filter 400a. In one embodiment, the warping factor ρ can range from −1 to +1, where values less than 0 represent warping toward lower frequencies, a value of 0 represents no warping, and values greater than 0 represent warping toward higher frequencies. The warping factor used in FIG. 3B above, for example, could have a value of −0.9 in one embodiment. Many other ranges of the warping factor ρ are possible in various embodiments.

FIG. 4B illustrates another implementation of an all-pass filter 400b. The all-pass filter 400b is an IIR filter having a Direct Form II structure. The Direct Form II structure of the all-pass filter 400b has two multipliers 425, 428 having the warping factor ρ (or −ρ), two adders 424, 423, and one delay block 426. The all-pass filter 400b receives an input signal 422 and provides an output signal 432. Because the all-pass filter 400b has one delay block 426 as opposed to the two delay blocks 406, 412 of the all-pass filter 400a, the all-pass filter 400b can use computing resources more efficiently than the all-pass filter 400a in some implementations.

Referring to FIG. 4C, another all-pass filter 400c is shown. The all-pass filter 400c, like the all-pass filters 400a, 400b, receives an input signal 442 and provides an output signal 454. In the configuration shown, the all-pass filter 400c has one multiplier, one adder, one subtraction block, and two delay blocks 444, 452. Similar to the all-pass filters 400a and 400b, the multiplier 448 of the all-pass filter 400c has a value that is a warping factor ρ. Because the all-pass filter 400c has one multiplier 448, the structure of the filter 400c can be considered as a single multiplier form. Advantageously, the single multiplier form of the all-pass filter 400c can use computing resources more efficiently than the all-pass filters 400a, 400b due to a small incremental cost of cascading multiple single-multiplier all-pass filters 400c, as shown in FIG. 5.

Figure 5:
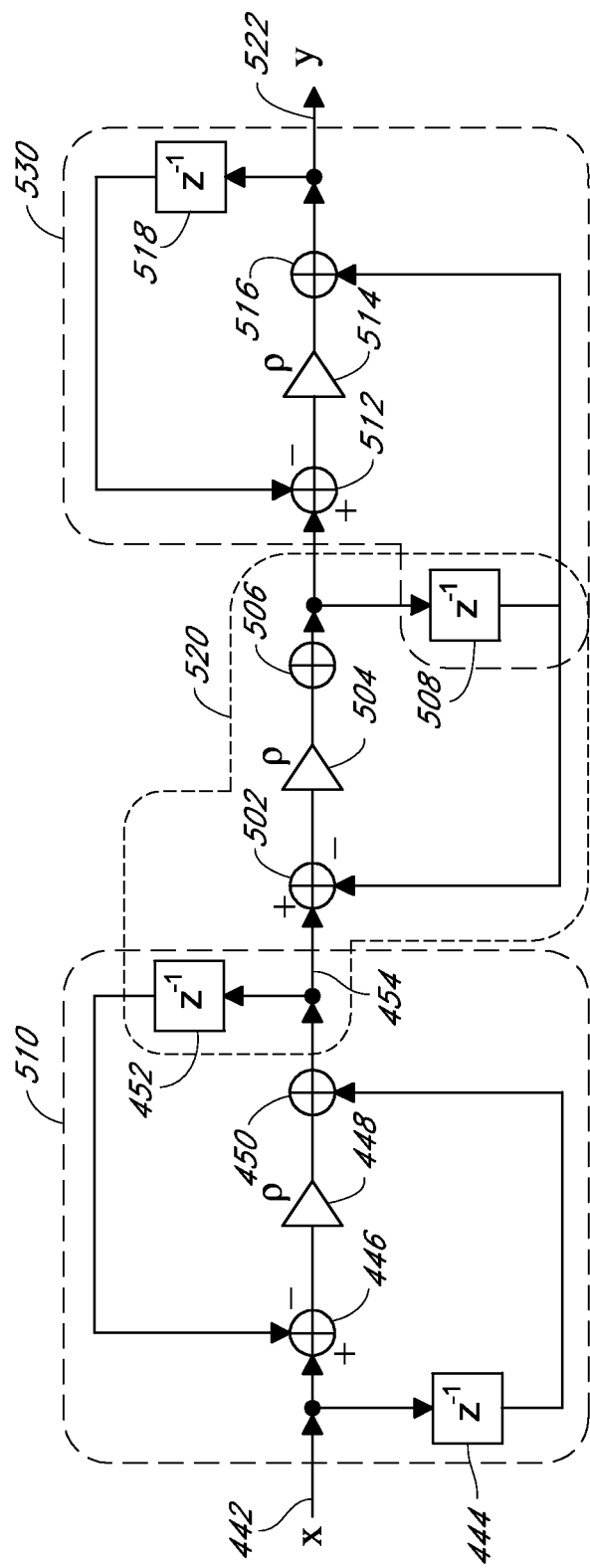
FIG. 5 illustrates an embodiment of a cascade of the all-pass filters of FIG. 4C.

FIG. 5 illustrates three cascaded all-pass filters 510, 520, and 530. Each filter 510, 520, 530 is illustrated by dashed lines surrounded the respective filter. FIG. 5 illustrates that filters 510, 520, 530 using the single multiplier form can be efficiently cascaded. In particular, in certain embodiments each additional all-pass filter 520, 530 cascaded with a first all-pass filter 510 adds an incremental cost of one multiplier, one adder, one subtraction block and one delay block.

The first all-pass filter 510 in the cascade includes all the elements of the all-pass filter 400c. The second all-pass filter 520 in the cascade shares the delay block 452 and adds an incremental cost of a subtraction block 502, a multiplier 504, an adder 506, and a delay block 508. Likewise, the third all-pass filter 530 shares the delay block 508 with the second all-pass filter 520 and adds a subtraction block 512, a multiplier 514, an adder 516, and a delay block 518. Advantageously, the single multiplier form facilitates using fewer elements or blocks in a cascade of filters and thereby facilitates more efficient use of computing resources.

Figure 6A:
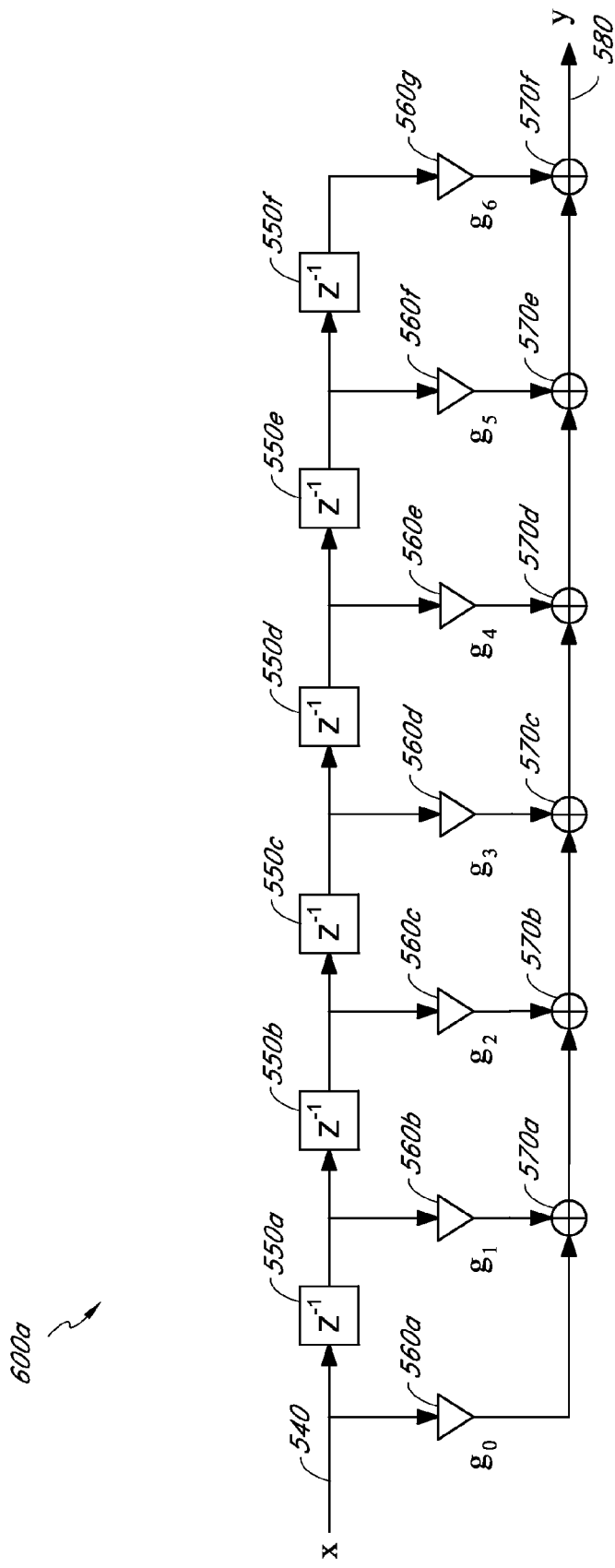
FIG. 6A illustrates an example initial filter.
Figure 6B:
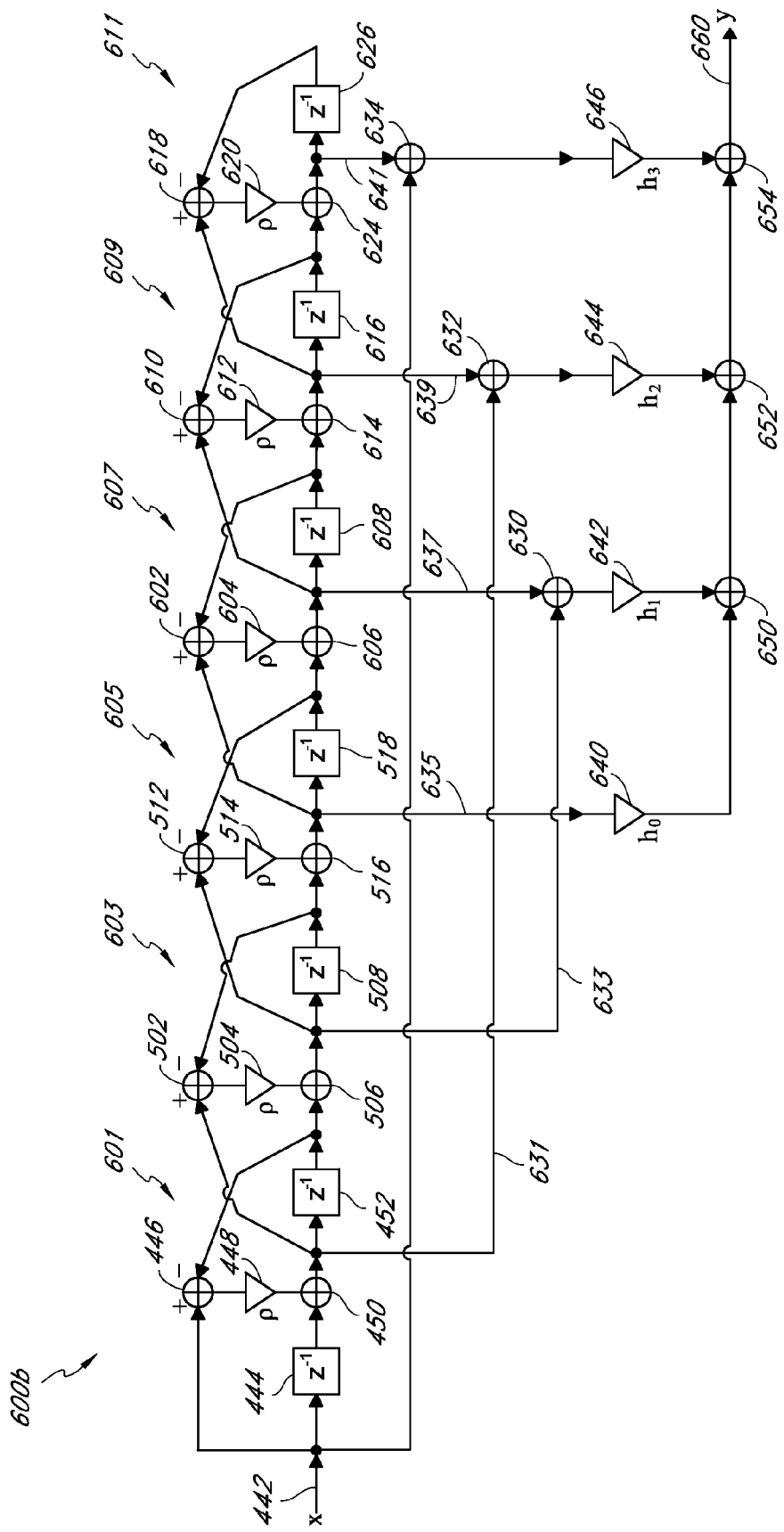
FIG. 6B illustrates an embodiment of a equalization filter designed by frequency-warping the example initial filter of FIG. 6A using the all-pass filters of FIG. 4C.

FIG. 6A illustrates an example initial filter 600a, from which an example frequency-warped equalization filter 600b in FIG. 6B can be designed. The initial filter 600a is a FIR filter having four frequency bands (not shown) in the depicted embodiment. The number of frequency bands is chosen for illustration purposes only and may be varied. In addition, the initial filter 600a is depicted in Direct Form. Other forms or structures of FIR filters may be used to design an equalization filter in certain embodiments. In addition, more than one FIR filter may be used to design an equalization filter in some implementations.

The initial filter 600a receives an input signal 540 and filters the input signal 540 to produce an output signal 580. The initial filter 600a includes delay blocks 550a-550f, multipliers 560a-560g, and adders 570a-570f. Arrows indicate direction of signal or algorithmic flow. Each of the multipliers 570a-570f has a value that is a coefficient of the initial filter 600a (represented by $g_0$ through $g_6$, respectively). The filter coefficients $g_0$ through $g_6$ may be chosen in one embodiment to enable at least some of the frequency bands of the initial filter 600a to have center frequencies that are relatively higher than desired center frequencies of an equalization filter. As a result, the initial filter 600a can have favorable computing resource usage characteristics.

Advantageously, these center frequencies can be frequency-warped by replacing each delay block 550 with an all-pass filter. FIG. 6B, for instance, illustrates an example embodiment of a frequency-warped equalization filter 600b designed from the initial filter 600a. The frequency-warped equalization filter 600b may be used, for example, in an equalizer system such as the system 100 described above.

In certain embodiments, the equalization filter 600 employs a bank of cascaded all-pass filters 601, 603, 605, 607, 609, and 611 consolidated into a single filter 600b using the principle of linear superposition. Each all-pass filter 601, 603, 605, 607, 609, and 611 replaces a delay block 550 in the initial filter 600a. In the depicted embodiment, each all-pass filter 601, 603, 605, 607, 609, and 611 is configured in the single multiplier form described above with respect to FIGS. 4C and 5. The equalization filter 600 has an overall FIR structure with the individual all-pass filters 601, 603, 605, 607, 609, and 611 each configured in an IIR structure. Thus, in certain embodiments the equalization filter 600 can be considered either a FIR or IIR filter, or a hybrid of both.

In the equalization filter 600b, the four frequency bands of the initial filter 600a are frequency-warped into four new frequency bands. At least some of these new frequency bands can have lower center frequencies than at least some of the frequency bands of the initial filter 600a. Thus, lower frequencies (e.g., bass frequencies) can be equalized or adjusted more efficiently by the equalization filter 600b in certain embodiments.

For convenience, reference numerals from FIGS. 4C and 5 are repeated for the first three cascaded all-pass filters 601, 603 and 605. Thus, these filters 601, 603, and 604 include the components 444 through 518 described above. Each of the three additional filters 607, 609 and 611 include additional incremental filter elements. Thus, for example, the filter 607 shares the delay block 518 with the filter 605 and includes a subtraction block 602, a multiplier 604, an adder 606, and a delay block 608. Likewise, the filter 609 shares the delay block 608 with the filter 607 and includes a subtraction block 610, a multiplier 612, an adder 614, and a delay block 616. Similarly, the filter 611 shares the delay block 616 with the filter 609 and also includes a subtraction block 618, a multiplier 620, an adder 624, and a delay block 626.

Four multipliers 640, 642, 644, and 646 are shown in communication with the all-pass filters 601-611. These multipliers represent coefficients $h_0$, $h_1$, $h_2$, and $h_3$ of the equalization filter 600b. Four coefficients are provided in the equalization filter 600b rather than seven due to symmetry of the coefficients. By having symmetric coefficients, the equalization filter 600b can share coefficients amongst the filters 601-611 and thereby use computing resources more efficiently. The coefficients may be asymmetric in certain other implementations.

In more detail, the output 637 of the filter 607 is combined with the output 633 of the filter 603 by adder 630, which provides an output to the multiplier 642 (coefficient $h_1$). Likewise, the output 639 of the filter 609 is combined with the output 631 of the filter 601 and is provided to adder 632, which provides an output to the multiplier 644 (coefficient $h_2$). The output 641 of the filter 611 is combined with the input signal 442 and is provided to adder 634, which provides an output to the multiplier 646 (coefficient $h_3$). In addition, the output 635 of the filter 605 is provided to the multiplier 640 (coefficient $h_0$). The outputs of each multiplier 640, 642, 644 and 646 are summed together by adders 650, 652 and 654, respectively, to produce an output signal 660. In certain embodiments, the outputs of the filters 601-611 are therefore superimposed together.

When a user adjusts gains of one or more sliders, in certain implementations this can cause the filter coefficients $h_0$-$h_3$ of the equalization filter 600 to be recalculated. Because the outputs of the filters 601-611 are superimposed, in certain embodiments changing the filter coefficients $h_0$-$h_3$ is performed by solving a system of simultaneous equations.

Each filter 601-611 in the example equalization filter 600b includes the same warping factor ρ, as represented by multipliers 448, 504, 514, 604, 612, and 620. Adjustment of this warping factor ρ enables adjustment of the amount of warping in the equalization filter 600b, where each filter 601-611 corresponds to one frequency band. For example, the warping factor ρ enables at least some higher frequency bands in the initial filter 600a to be frequency-warped to lower frequency bands in the equalization filter 600b. Advantageously, in certain embodiments the equalization filter 600b can therefore minimize the affects of changes in one frequency band on adjacent bands, thereby increasing the accuracy of the equalization filter 600b over currently-available equalization filters. In addition, the equalization filter 600b can use resources similar to or better than certain currently-available IIR equalization filters.

The spacing of the frequency bands (e.g., the spacing of the center frequencies of the bands) represented by the filters 601-611 can be adjusted in certain embodiments by the frequency warping factor ρ, which in one embodiment represents one degree of freedom for adjusting the entire set of frequency bands. Advantageously, the warping factor ρ in one embodiment can be adjusted to create a Bark scale or approximate Bark scale of frequency bands. However, if other spacing is desired (e.g., ANSI spacing), achieving such spacing with the one degree of freedom of the warping factor ρ can be difficult.

To overcome this problem, in some implementations additional frequency bands can be added by providing additional filters. The desired center frequencies can then be approximated by interpolating between certain of the frequency bands in the equalization filter 600b at potentially some additional cost of computing resources. For example, if a desired center frequency of a frequency band is 125 Hz, and the closest center frequency in the filter 600b is 100 Hz, a filter having a center frequency of 150 Hz can be added to the equalization filter 600b. The desired center frequency of 125 Hz can then be interpolated from the 100 Hz and 150 Hz frequency bands.

In certain embodiments, interpolations with additional bands can be implemented by adding additional all-pass filters or other filter types for each added frequency band. The resulting equalization filter 600b may therefore have a longer filter structure with additional coefficients or internal gains. These internal gains may be greater in number than the number of user input gains (e.g., slider inputs). Thus, in one embodiment the higher number of internal gains in the filter 600b could be a linear combination of the lower number of user input gains.

In certain other embodiments, certain drawbacks of using one warping factor ρ can be reduced or overcome by designing a filter that includes separate warping factors for some or all of the frequency bands. An example implementation of one such filter design is illustrated in FIGS. 7 and 8 below.

Figure 7:
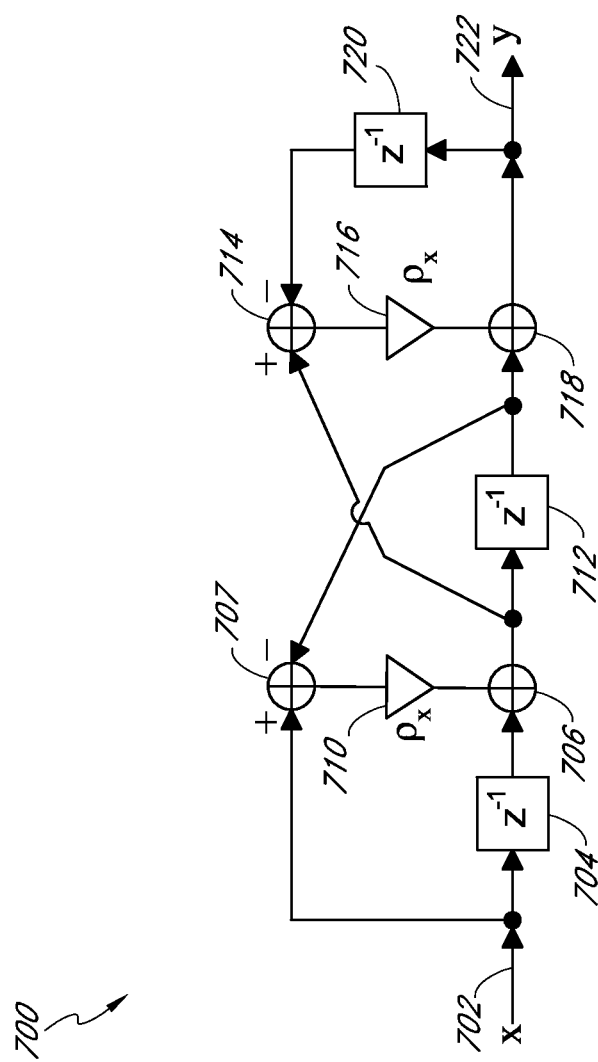
FIG. 7 illustrates another embodiment of an all-pass filter for use with certain equalization filters.
Figure 8:
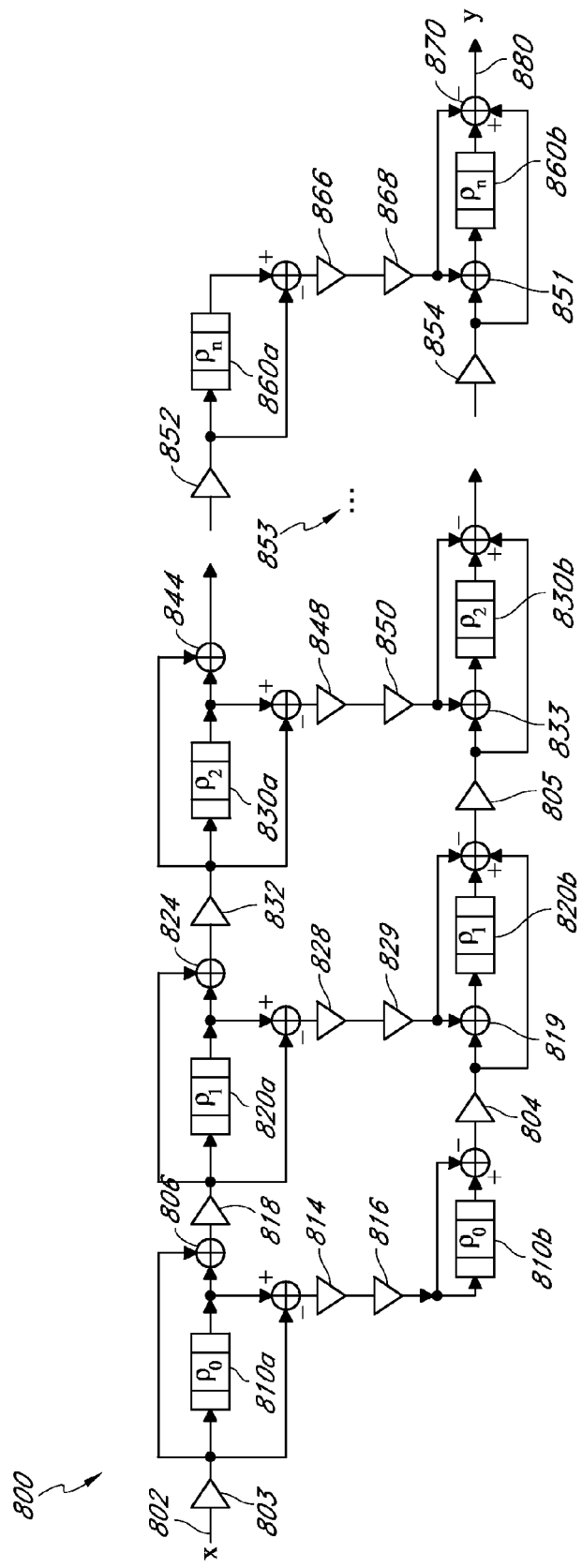
FIG. 8 illustrates an embodiment of an equalization filter using the all-pass filter of FIG. 7.

FIG. 7 illustrates an example of a second-order all-pass filter 700 that can be used to provide separate warping factors for a frequency band of an equalization filter. Multiple all-pass filters 700 can be cascaded together to create an equalization filter, an example of which is described below with respect to FIG. 8.

The all-pass filter 700 has a different structure than the all-pass filters described above with respect to FIGS. 4 through 6. The all-pass filter 700 receives an input signal 702, which is provided to a delay block 704 and to a subtraction block 707. The output of the delay block 704 is provided to an adder 706, while the output of the subtraction block 707 is provided to a multiplier block 710. The value of the multiplier block 710, in the depicted embodiment, represents a frequency warping factor $\rho_x$. The subscript "x" denotes that the frequency warping factor $\rho_x$ can be different for different frequency bands.

The output of the multiplier 710 is provided to the adder 706. The adder 706 provides an output to a delay block 712, which in turn provides an output to the subtraction block 707 and to an adder 718. In addition, the adder 706 provides an output to a subtraction block 714. The subtraction block 714 provides an output to a multiplier block 716, which also has the value $\rho_x$, the frequency warping factor. The multiplier 716 in turn provides an output to the adder 718, which provides an output to a delay block 720. The delay block 720 likewise provides an output to the subtraction block 714. Moreover, the adder 718 provides an output 722 of the all-pass filter 700.

FIG. 8 illustrates an embodiment of a frequency-warped equalization filter 800 that may use the all-pass filter 700 of FIG. 7. The equalization filter 800 may be used, for example, in an equalizer system such as the system 100 described above. The equalization filter 800 advantageously includes multiple frequency warping factors $\rho_x$, which enable the frequency bands of the equalization filter 800 to be separately tuned to desired center frequencies.

The equalization filter 800 has a plurality of blocks 810, 820, 830, 860, each of which represents a delay block of an initial filter (not shown) that has been replaced by an all-pass filter. The initial filter can be, for example, a FIR filter. In certain implementations, the all-pass filter used for each block 810, 820, 830, 860 can be the all-pass filter 700. Thus, for example, the input 702 of the all-pass filter 700 can correspond to the input to the block 810, and the output 722 of the all-pass filter 700 can correspond to the output of the block 810, and so on. However, any of the all-pass filter structures described herein or other all-pass filter structures may also be used with the equalization filter 800 in certain other embodiments. In addition, in some embodiments, different types of all-pass filter structures can be used for different frequency bands of the equalization filter 800.

In an embodiment, the initial filter upon which the equalization filter 800 is based has zeros at $f_s/4$, where $f_s$ represents the sampling frequency used. In certain embodiments, this initial filter configuration permits a relatively simple digital implementation that can minimize the complexity of a frequency-warped equalization filter 800 designed from the initial filter. The zero locations of the initial filter may have other values in various implementations.

For each frequency band in the example equalization filter 800, there can be two corresponding all-pass filters 700 having the same warping factor $\rho_x$, where "x" denotes the number of the frequency band (starting at 0 in the depicted example). The warping factor can differ for different frequency bands so as to provide more precise control over the center frequency for each band. For example, the all-pass filters provided in blocks 810a and 810b each correspond to a first frequency band having a warping factor $\rho_0$, blocks 820a and 820b correspond to a second frequency band having a warping factor $\rho_1$, and so on down to an $n^{th}$ frequency band having an $n^{th}$ warping factor ($\rho_n$). Ellipses 853 indicate that any number of frequency bands (and warping factors) can be provided in the equalization filter 800.

Advantageously, the warping factors enable the frequency-warped equalization filter 800 to filter audio signals more accurately than certain IIR equalization filters. Like the equalization filter 600b of FIG. 6B, the equalization filter 800 can minimize the affects of changes in one frequency band on adjacent bands, thereby increasing the accuracy of the filter 800.

The ability to more precisely adjust each center frequency comes at a cost of some additional complexity in some implementations. For example, more components (or operations) may be used in the all-pass filter 700 than in the all-pass filter 400c, and additional components may be used in the equalization filter 800 than in the equalization filter 600. However, this increase in usage of computing resources can still be less than that of currently-available FIR equalization filters, or even IIR equalization filters. For instance, a currently-available 10-band IIR biquad-based equalization filter might use somewhere between 6 and 10 million instructions per second (MIPS) to process one channel at 44.1 kHz on an ARM9e processor. In contrast, certain implementations of the equalization filter 800 can use about 4.3 or fewer MIPS to accomplish the same task with improved accuracy on the same processor.

Multiplier blocks 814, 828, 848, and 866 represent coefficients of the equalization filter 800. In an embodiment, each block 814, 828, 848, and 866 has a value $g_x * m_x$, where $g_x$ is a coefficient and $m_x$ is an adjustment factor. The adjustment factor $m_x$ compensates for variations of the frequency response of the equalization filter 800 caused by changing the warping factors $\rho_x$. The adjustment factor $m_x$ can have a value equal to a reciprocal of the gain (e.g., input by a slider) of the frequency band in one embodiment when all equalizer coefficients $g_x$ are set to unity. The adjustment factor $m_x$ in one embodiment enables the frequency response of a given frequency band to be more accurate.

Multiplier blocks 803, 804, 805, 816, 818, 829, 832, 850, 852, 854, and 868 represent divisions by 2. These blocks divide the audio signal in half to compensate for doubling of the audio signal by one or more of the adder blocks 806, 819, 824, 833, 844, and 851.

Advantageously, in certain embodiments the equalization filter 800 may be implemented in a fixed-point processor. In one such embodiment, the equalization filter 800 may be implemented without any multiplication operations, which operations can generally consume more computing resources than other arithmetical operations. Multiplication operations can be eliminated in one embodiment by reducing the number of digits of precision used for the warping factors and/or coefficients. By using a few bits of precision, for example, multiplications can be replaced with additions and shifts. In addition, divisions by 2 can be replaced by shifts. Thus, the equalization filter 800 can be robust numerically, even for low-resolution fixed-point math operations.

Advantageously, eliminating or reducing the number of multiplication operations can be achieved in certain embodiments due to the overall FIR structure of the equalization filter 800. Certain currently-available IIR equalization filters, on the other hand, use several bits of precision to reduce rounding errors. Using fewer bits in the equalization filter 800, on the other hand, can reduce accuracy, but the accuracy of the filter 800 can still be much greater than that of currently-available IIR equalization filters.

In certain other embodiments, accuracy of the equalization filter 800 can be further improved by adding additional internal frequency bands. This technique may include performing the interpolation operations described above with respect to FIG. 6B. Moreover, in certain embodiments the accuracy of the equalization filter 800 can be further improved by filtering the input audio signal 802 twice with the equalization filter 800. Both of these techniques can consume additional computing resources in some implementations.

In addition, in some implementations, some computing resources can be saved by removing or altering some of the blocks in the equalization filter 800. For example, for the frequency band represented by the warping factors $\rho_n$, a divide-by-two block 868 may be removed. Thus, the output of the block 866 could be provided directly to the adder 851 and to the subtraction block 870. In another embodiment, the subtraction block 870 could be modified to not receive the output from the multiplier 868. Thus, the subtraction block 870 may become an adder that adds the output of the block 860*b* and the multiplier 854. One or both of these modifications may be used for some or all of the frequency bands in the equalization filter 800. While these modifications can reduce the accuracy of the equalization filter 800, the computing resource savings can be significant in some implementations. In addition, other modifications may be possible to further reduce computing resource usage.

In addition to being used as a filter in a graphic equalizer, certain embodiments of the equalization filter 800 can also be used in a parametric or semi-parametric equalizer. The user inputs to the equalization filter 800 can therefore include adjustments of center frequencies in addition to gain adjustments at the center frequencies. The user inputs can advantageously cause one or more frequency warping factors to change, giving a user control over center frequency values. Because the equalization filter 800 can be implemented without multiplications in a fixed-point processor, a parametric or semi-parametric equalizer using the equalization filter 800 can be more numerically robust than certain other parametric or semi-parametric equalizers.

Figure 9:
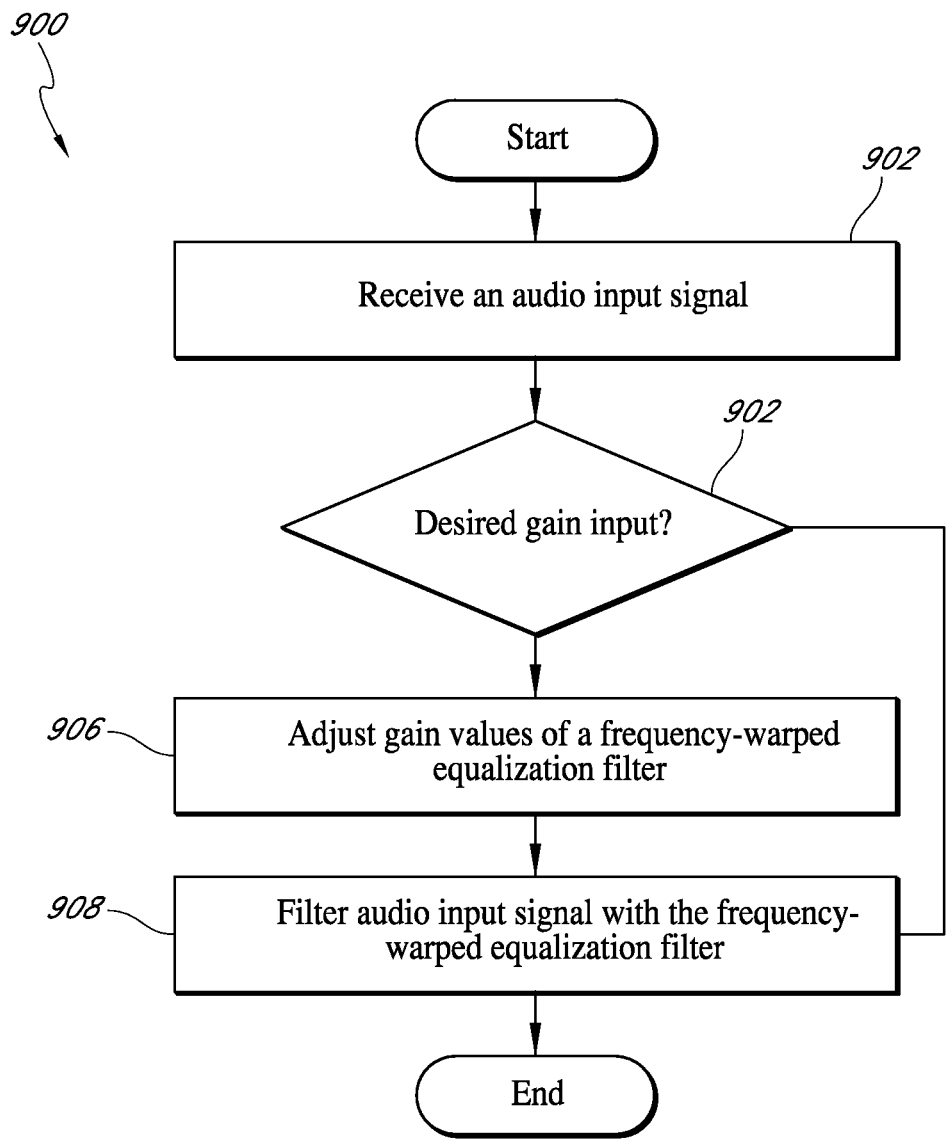
FIG. 9 illustrates an embodiment of a process for filtering audio signals using a frequency-warped equalization filter.

FIG. 9 illustrates an example process 900 for filtering audio signals using a frequency-warped equalization filter. The process 900 can be implemented in certain embodiments by an equalization system, such as the equalization system 100. The process 900 may advantageously enable accurate and efficient equalization of audio signals.

At block 902, an audio input signal is received. The audio input signal can be any audio signal, such as a music signal, speech signal, or the like. The audio input signal can be received from a file stored on a computer-readable medium, from a network resource such as a web site, or from another source.

It is determined at block 904 whether a desired gain input is provided. The desired gain input can be provided from a set of sliders or the like (see, e.g., FIG. 2) and can represent gain values for one or more frequency bands of the audio input signal. The desired gain input can be provided by a user in one embodiment.

If a desired gain input is provided, at block 906 internal gain values of a frequency-warped equalization filter are adjusted based at least in part on the desired gain input. The internal gain values can be coefficients of the frequency-warped equalization filter. Adjusting these internal gain values can include recalculating the internal gain values to achieve or approximate the desired gain values of one or more frequency bands.

If no desired gain input is provided at block 904, or after block 906, the process 900 proceeds to block 908. At block 908, the audio input signal is filtered with the frequency-warped equalization filter. Advantageously, the equalization filter used can be any of the frequency-warped equalization filters used herein. As such, the equalization filter can equalize the audio signal more efficiently and/or accurately than many currently-available equalization filters.

Figure 10A:
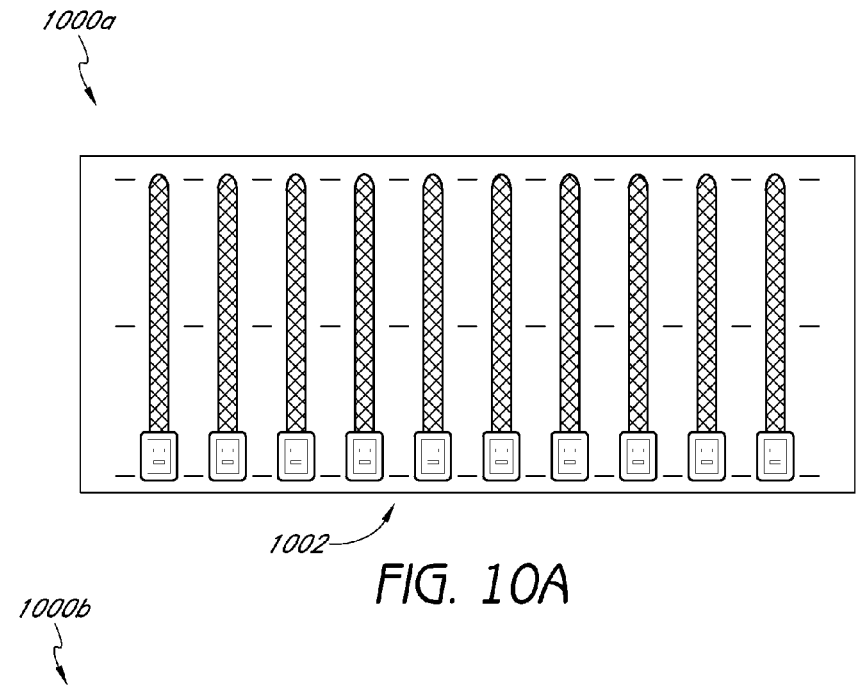
FIG. 10A illustrates a graphic equalizer with example slider settings.
Figure 10B:
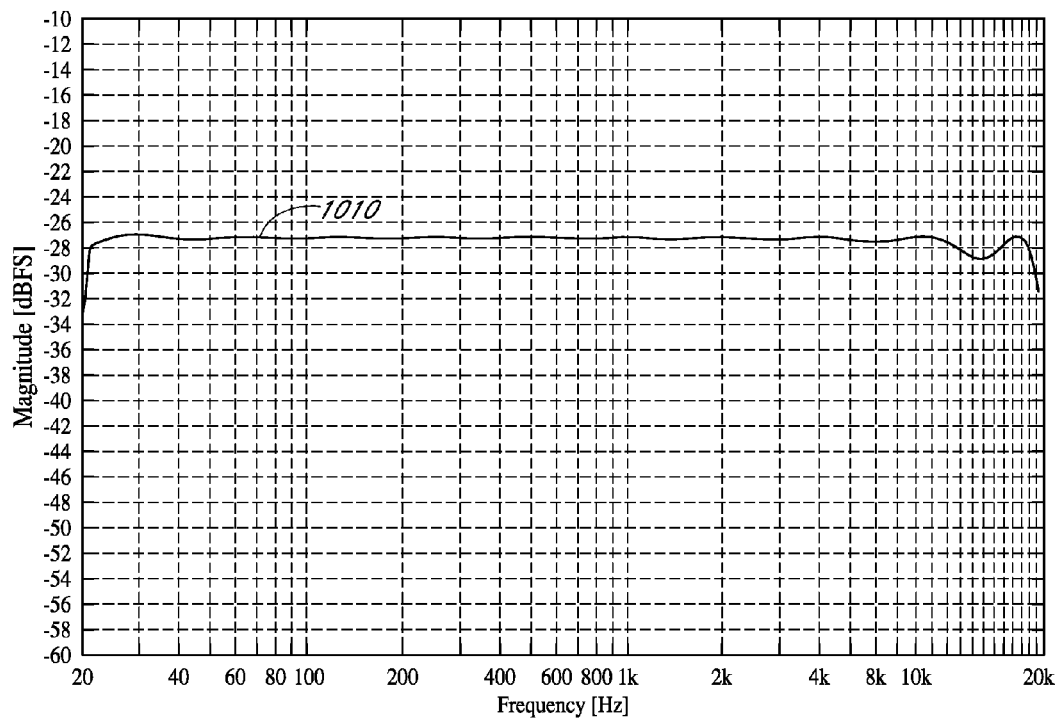
FIG. 10B illustrates an example frequency response curve of certain embodiments of an equalization filter corresponding to the example slider settings of FIG. 10A.

FIG. 10A shows an example graphic equalizer 1000*a* with sliders 1002 set in a uniformly low position. Ten sliders 1002 are shown, which correspond to ten frequency bands. The actual values of the center frequencies are not shown, but the center frequencies can be of any scale (e.g., Bark or ANSI). The graphic equalizer 1000*a* can provide an output signal to an equalization filter, such as any of the frequency-warped equalization filters described above (e.g., modified to include ten frequency bands). FIG. 10B illustrates an example frequency response of an equalization filter based at least in part on the input from the graphic equalizer 1000*a*. A trace 1010 illustrates a substantially flat frequency response with the sliders 1002 in the same or substantially same position. The flat frequency response 1000*b* extends through the entire or substantially entire audible frequency range from 20 hertz to 20 kilohertz. More particularly, in certain embodiments, the flat or substantially flat frequency response 1000b extends from about 100 hertz to about 10 kilohertz.

Figure 11A:
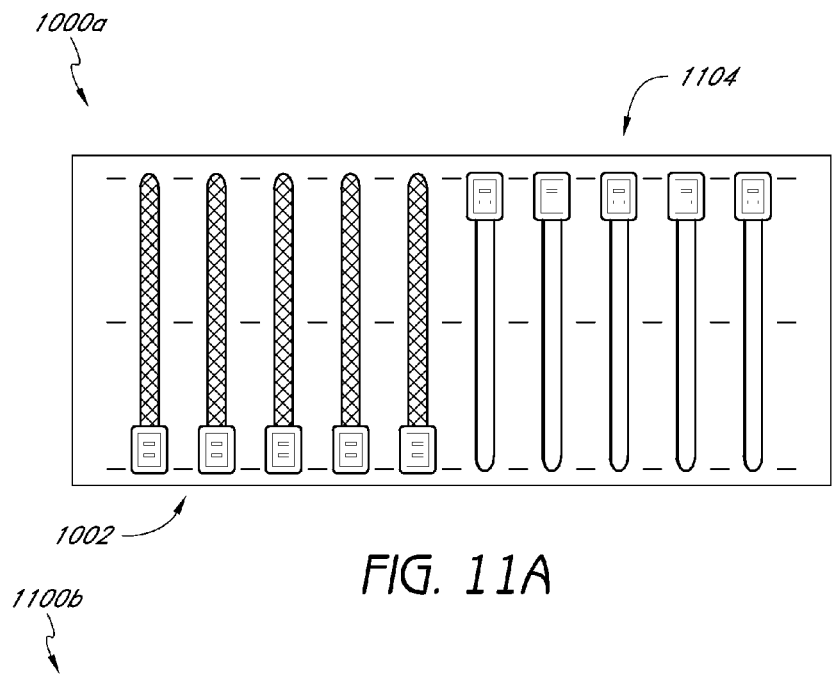
FIG. 11A illustrates another graphic equalizer with example slider settings.
Figure 11B:
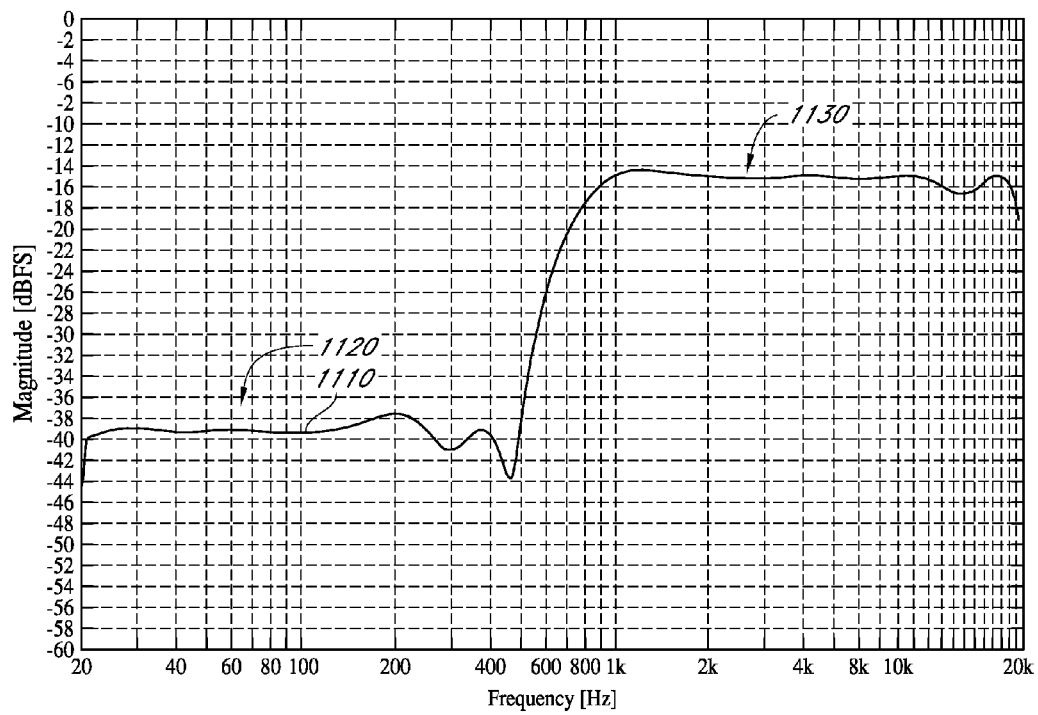
FIG. 11B illustrates an example frequency response curve of certain embodiments of an equalization filter corresponding to the example slider settings of FIG. 11A.

FIG. 11A shows another configuration of a graphic equalizer 1100a. Sliders 1102 of the graph equalizer 1100a are in a low position, whereas sliders 1104 are in a high position relative to the sliders 1102. FIG. 11B illustrates a frequency response 1100b of an equalization filter corresponding to the inputs of the graphic equalizer 1100a. Where the sliders 1102 are low, a trace 1110 of the frequency response 1100b is similarly low at region 1120. Where the sliders 1104 are high, the trace 1110 is high in the region 1130. Thus, one can see that the frequency response 1100b corresponds accurately or substantially accurately to the settings of the sliders 1102 and 1104 in certain embodiments.

Figure 12A:
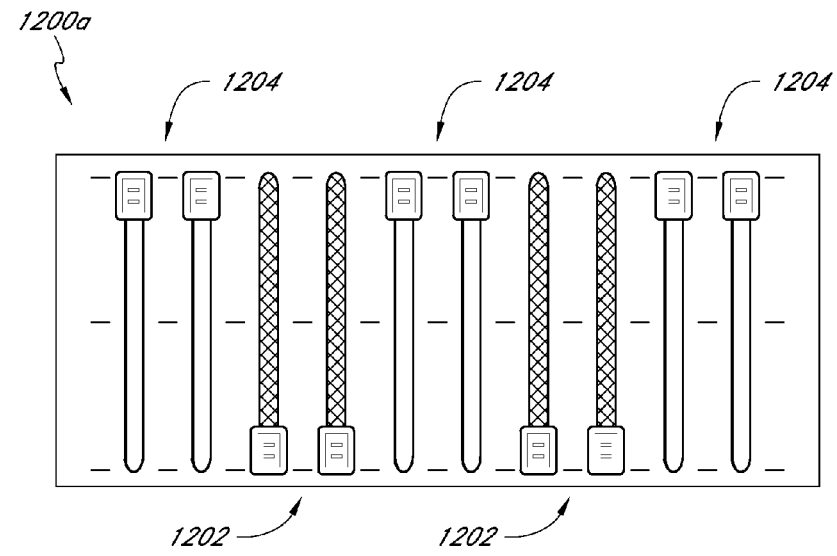
FIG. 12A illustrates another graphic equalizer with example slider settings.
Figure 12B:
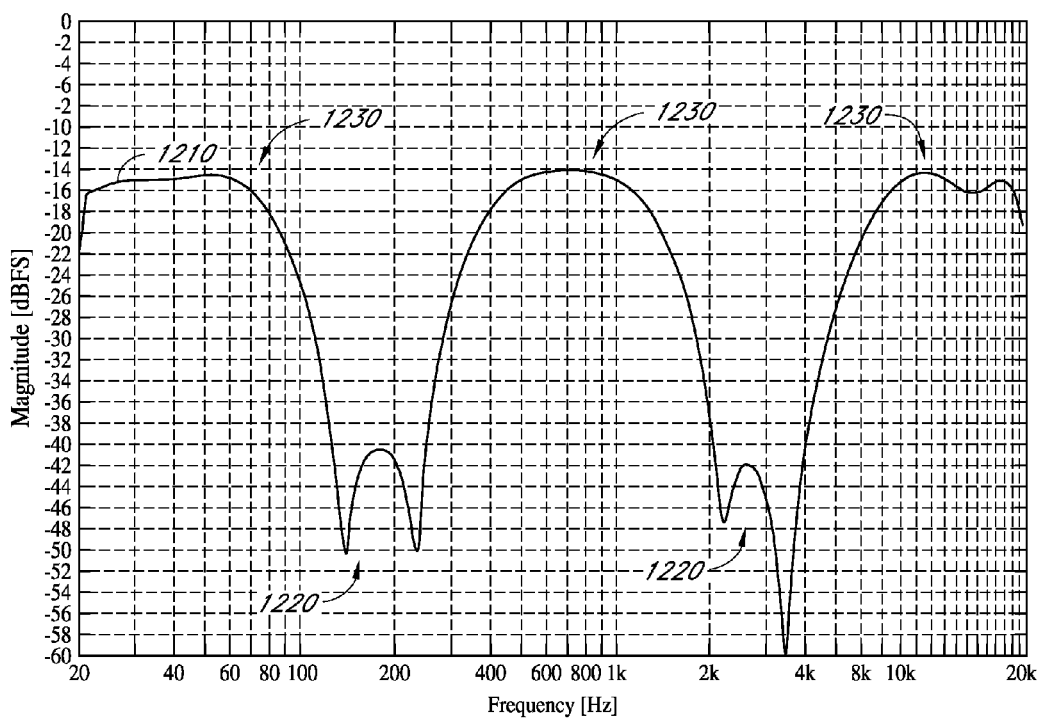
FIG. 12B illustrates an example frequency response curve of certain embodiments of an equalization filter corresponding to the example slider settings of FIG. 12A.

FIG. 12A illustrates another configuration of a graphic equalizer 1200a. Sliders 1204 are in a high position while sliders 1202 are in a low position. FIG. 12B illustrates a frequency response 1200b corresponding to the slider positions 1202 and 1204. Where the sliders 1202 are in a low position, a trace 1210 of the frequency response 1200b is also in a low position as illustrated by regions 1220. Where the sliders 1004 are in high positions, the trace 1210 of the frequency response 1200b is also in high positions as illustrated by the regions 1230. Thus, FIGS. 12A and 12B further illustrate accuracy that can be achieved by certain embodiments of the frequency-warped equalization filters described herein.

Figure 13:
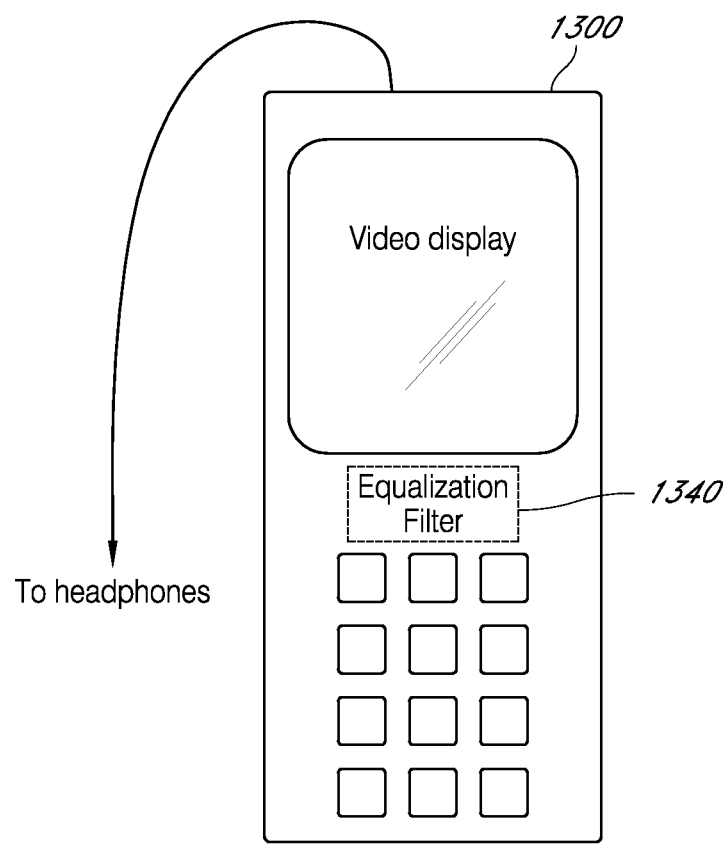
FIG. 13 illustrates an example mobile device where the functionalities of equalization filters can be implemented to provide an enhanced listening experience to a listener.

FIG. 13 illustrates an example mobile device 1300 that can include an equalization filter 1340, which can be implemented as any of the equalization filters described above. Because the mobile device 1300 may have fewer computing resources than other computing devices, the mobile device 1300 may benefit from having an equalization filter 1340 that provides greater accuracy while using less computing resources. Devices other than mobile devices can also implement any of the equalization filters described herein in various implementations.

Depending on the embodiment, certain acts, events, or functions of any of the algorithms described herein can be performed in a different sequence, may be added, merged, or left out all together (e.g., not all described acts or events are necessary for the practice of the algorithm). Moreover, in certain embodiments, acts or events may be performed concurrently, e.g., through multi-threaded processing, interrupt processing, or multiple processors or processor cores, rather than sequentially.

The various illustrative logical blocks, modules, and algorithm steps described in connection with the embodiments disclosed herein may be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the disclosure.

The various illustrative logical blocks and modules described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be a processor, controller, microcontroller, or state machine, combinations of the same, or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium can be coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

While the above detailed description has shown, described, and pointed out novel features as applied to various embodiments, it will be understood that various omissions, substitutions, and changes in the form and details of the devices or algorithms illustrated may be made without departing from the spirit of the disclosure. As will be recognized, certain embodiments of the inventions described herein may be embodied within a form that does not provide all of the features and benefits set forth herein, as some features may be used or practiced separately from others. The scope of certain inventions disclosed herein is indicated by the appended claims rather than by the foregoing description. All changes which come within the meaning and range of equivalency of the claims are to be embraced within their scope.

What is claimed is:

1. An audio equalization method, the method comprising:
selecting an initial digital filter, the initial digital filter corresponding to a plurality of frequency bands;
frequency warping the initial digital filter to generate an audio equalization filter, the audio equalization filter comprising a finite impulse response (FIR) filter, said frequency warping the initial digital filter comprising applying a plurality of different warping factors to the plurality of frequency bands of the initial digital filter; and
said applying the plurality of different warping factors comprising using a different warping factor for at least two of the plurality of frequency bands of the audio equalization filter, such that the at least two frequency bands of the audio equalization filter are configured to be tunable to separate center frequencies;
wherein the audio equalization filter is configured to filter an input audio signal such that certain frequencies of the input audio signal are selectively adjusted.

2. The audio equalization method of claim 1, wherein said frequency warping the one or more digital filters comprises transforming at least one of the frequency bands from a higher band to a lower band.

3. The audio equalization method of claim 1, wherein said frequency warping the one or more digital filters comprises transforming at least one of the frequency bands from a lower band to a higher band.

4. The audio equalization method of claim 1, further comprising:
adding an additional digital filter to the audio equalization filter, and
creating a new frequency band of the audio equalization filter by at least interpolating between a first frequency band of the additional digital filter and a second frequency band of the audio equalization filter.

5. The audio equalization method of claim 1, further comprising selecting the warping factors such that said frequency warping causes the at least two frequency bands to be spaced according to a mel scale.

6. The audio equalization method of claim 1, further comprising selecting the warping factors such that said frequency warping causes the at least two frequency bands to be spaced according to a Bark scale.

7. The audio equalization method of claim 1, wherein said frequency warping is implemented by one or more processors.

8. A system for equalizing audio, the system comprising:
an audio equalization filter implemented in one or more processors, the audio equalization filter comprising a finite impulse response (FIR) filter, the audio equalization filter configured to be applied to an input audio signal by the one or more processors so as to selectively adjust frequency bands of the input audio signal;
the audio equalization filter being generated from an initial digital filter by at least frequency warping the initial digital filter, said frequency warping comprising applying a plurality of different warping factors to at least some of a plurality of frequency bands of the initial digital filter, the plurality of different warping factors comprising different warping factors for at least two of the plurality of frequency bands, such that the at least two frequency bands of the audio equalization filter are configured to be tunable to separate center frequencies.

9. The system of claim 8, further comprising a user control configured to provide functionality for a user to adjust the center frequencies of the at least two frequency bands.

10. The system of claim 9, wherein the user control is configured to adjust at least some of the warping factors responsive to user adjustment of the user control.

11. The system of claim 8, wherein the audio equalization filter comprises symmetric coefficients.

12. The system of claim 8, wherein the audio equalization filter is further configured to be frequency warped by at least replacing one or more delay blocks of the initial digital filter with one or more all-pass filter.

13. The system of claim 8, wherein the audio equalization filter comprises a parametric equalizer.

14. The system of claim 8, wherein the audio equalization filter comprises a graphic equalizer.

* * * * *